United States Patent [19]

Bert et al.

[11] Patent Number: 4,481,486
[45] Date of Patent: Nov. 6, 1984

[54] ULTRA-HIGH FREQUENCY OSCILLATOR WITH DIELECTRIC RESONATOR OF THE COMPACT HYBRID CIRCUIT TYPE

[75] Inventors: Alain Bert; Didier Kaminsky, both of Paris, France

[73] Assignee: Thomson-CSF, Paris, France

[21] Appl. No.: 361,751

[22] Filed: Mar. 25, 1982

[30] Foreign Application Priority Data

Mar. 27, 1981 [FR] France ................. 81 06185

[51] Int. Cl.³ ............................... H03B 5/18
[52] U.S. Cl. ................... 331/99; 331/117 D; 331/117 FE
[58] Field of Search ......... 331/96, 99, 107 SL, 331/117 D, 117 FE

[56] References Cited

U.S. PATENT DOCUMENTS 4,149,127  4/1979  Murakami et al. ......... 331/117 D X

FOREIGN PATENT DOCUMENTS

| 0009435 | 9/1979 | European Pat. Off. |
| 2837817 | 8/1978 | Fed. Rep. of Germany |
| 3007580 | 2/1980 | Fed. Rep. of Germany |
| 2382797 | 2/1978 | France |
| 47107 | 4/1981 | Japan ............................ 331/96 |

OTHER PUBLICATIONS

1979, IEEE MTT-S International Microwave Symposium Digest, Saito et al., "A 6 GHz Highly Stabilized GaSa FET Oscillator Using a Dielectric Resonator", pp. 197–199.

1979, IEEE MTT-S International Microwave Symposium Digest, Mishima et al., "FM Noise of Transmission-Type Injection-Locked GaAs FET Osciallators and Amplifiers", pp. 194–196.

NEC Research & Development, No. 45, Apr. 1977, Abe et al., "A High-power Microwave GaAs FET Oscillator", pp. 58–65.

EDN, vol. 13, No. 2, Feb. 1968, "Anatomy of the LID", pp. 70–73.

Primary Examiner—Eugene R. Laroche
Assistant Examiner—Robert Pascal
Attorney, Agent, or Firm—Oblon, Fisher, Spivak, McClelland & Maier

[57] ABSTRACT

An ultra-high frequency oscillator having a very high thermal stability using a transistor coupled by a microstrip-type transmission line to a dielectric resonator with a very low temperature coefficient. It incorporates a field effect or bipolar transistor and an insulating substrate metallized or formed of metal on one face forming the ground plane. The latter projects over the substrate at a point close to two microstrip lines deposited on the face of the substrate opposite to the ground plane, the transistor being welded to said projecting point of the ground plane and to the microstrip lines. The assembly forms a compact hybrid circuit.

7 Claims, 9 Drawing Figures

ULTRA-HIGH FREQUENCY OSCILLATOR WITH DIELECTRIC RESONATOR OF THE COMPACT HYBRID CIRCUIT TYPE

BACKGROUND OF THE INVENTION

The invention relates to high stability, ultra-high frequency oscillators using an active element coupled by a transmission line to a dielectric resonator having a very low temperature coefficient.

In the case of frequencies exceeding 1 GHz, the active element of such oscillators can either be a diode or a transistor.

The advantages resulting from the use of a transistor are a higher power, a better efficiency and a greater possibility of integration onto a single substrate of the system formed by the active element and the remainder of the oscillator.

However, construction is more complex and the cost price can be too high for consumer use, such as television reception by satellite.

BRIEF SUMMARY OF THE INVENTION

The present invention obviates the latter disadvantage by proposing a construction which can be more easily fabricated, whilst retaining and maintaining the requirements of the frequency and temperature stability, compactness and low price, through the use of mass-produced components.

The ultra-high frequency oscillator stabilized by a dielectric resonator according to the invention comprises:

an insulating substrate having first and second large faces the second face being metallized or formed of metal to constitute a ground plane, said ground plane forming a projecting part beyond the substrate so as to form a flat area at the same level as one edge of the first face of the substrate;

two transmission lines of the microstrip type deposited on said first face, each of them having terminal parts close to one another and close to said one edge of the first face, and one of them being coupled with a dielectric resonator;

a transistor having a first electrode welded to said projecting part of said earth plane and two other electrodes welded respectively to said transmission lines.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
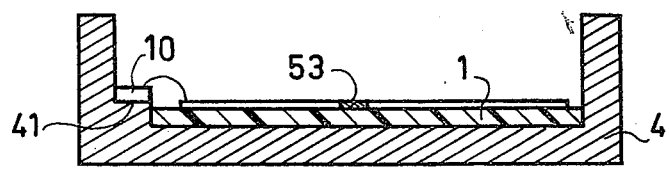
FIGS. 1 and 2 respectively in section and plan view an embodiment of the invention.
Figure 2:
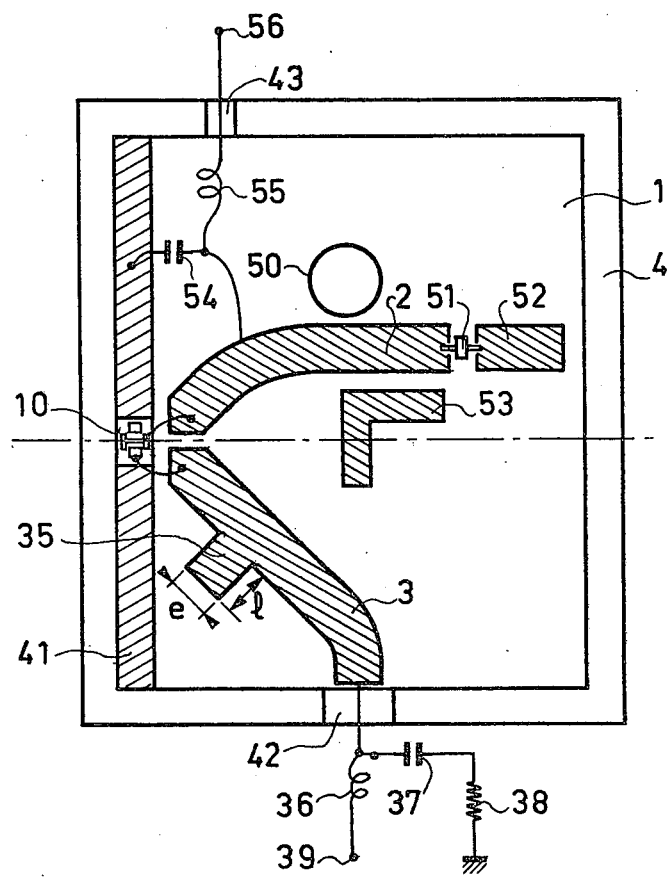

In the embodiments of FIGS. 1 and 2, the substrate for constituting the microstrip-type transmission lines 2 and 3 is in the form of an alumina layer 1 lining the bottom of a rectangular metallic structure 4, which has a raised portion forming a projection 41 along one of the inner edges of the structure. A not shown cover can be added for sealing the structure, slots 42, 43 in the edge facilitating the connection of lines 2 and 3 to power and/or polarization sources and to the load. According to a constructional variant, the connections to the sources and load are brought about by using passages passing through the structure.

Figure 3:
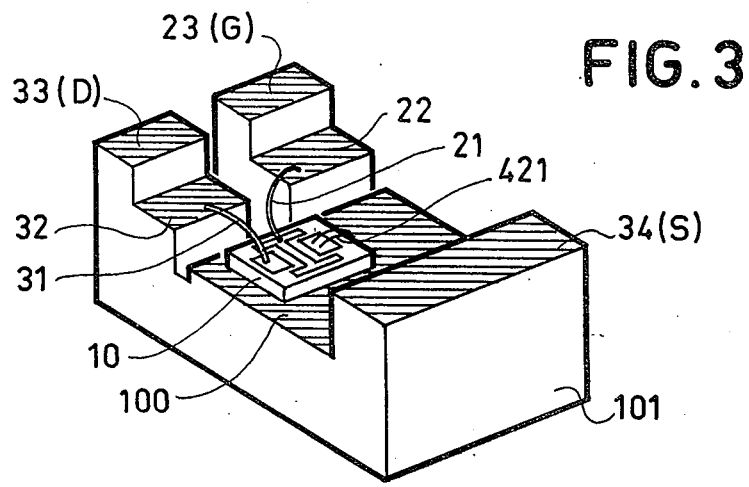
FIG. 3 a perspective view of a support which can be used for producing the embodiment of FIGS. 1 and 2.

Transistor 10, represented by a rectangle, in placed on projection 41 and can be welded in the "flip-chip" manner. For example, with a transistor normally fitted on its support 101 (FIG. 3) of the leadless inverted device type, the flip-chip welding must apply to the assembly of support 101 and transistor 10.

Figure 4:
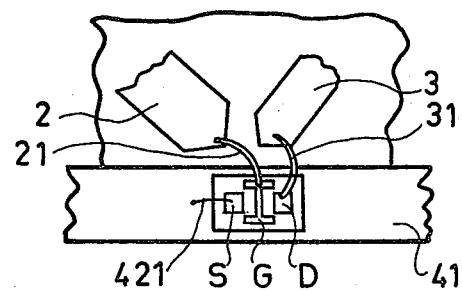
FIG. 4 a circuit diagram of a transistor in the case of an embodiment of FIGS. 1 and 2.

In accordance with FIG. 4, connection can be one of the following types (in the case of a field-effect transistor):

source S to ground (projection 41) by a connection 421;
gate G to line 2 by a connection 21;
drain D to line 3 by a connection 31.

By changing the supply direction, the positions of drain and source can be reversed.

In the case of the leadless inverted device support (FIG. 3), the latter has parallel conductive faces at the different levels intended for the connections:

of transistor 10 by adhesion or welding its back face to face 100 of support 101;

of connections 21 and 31 to faces 22 and 32 respectively, separated by an insulating slot;

of the ground connection connected to face 100 in the form of several small diameter connections 421 in order to limit the coupling inductance;

of electrodes S, G and D by welding face 34 (S) to projection 41, of face 23 (G) to line 2 and of face 33 (D) to line 3.

Transmission line 2 is slightly bent in order to reduce the overall dimensions of the oscillator assembly. With its auxiliary elements 50, 51, 52 and 53, it forms a device favouring a predetermined oscillation frequency fixed by the resonant frequency of element 50. Element 50 is a resonator constituted, for example, (FIG. 5) by a cylindrical ceramic section with a high relative dielectric constant of 35 to 40 having very low ultra-high frequency losses and a good thermal stability. The formula of the material forming resonator 50 is, for example, as follows:

$$Zr_xSn_{1-x}TiO_4$$

in which x is between 0.2 and 0.4.

Resonator 50 is positioned in a conventional manner. Propagation line elements 52, 53 constitute an exemplified solution shown in FIG. 5.

Figure 5:
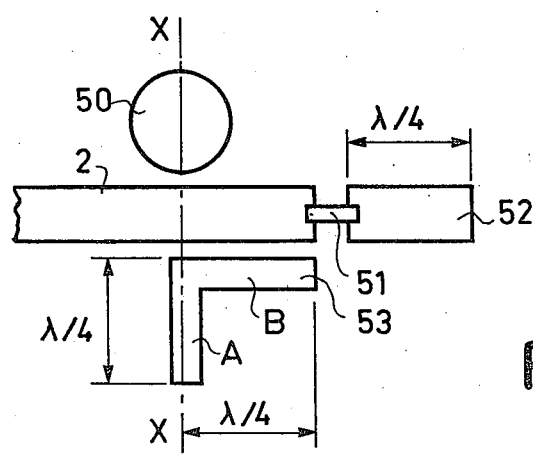
FIGS. 5, 7, 8 and 9 transmission line variants on the grid side of the transistor.

According to the diagram of FIGS. 2 and 5, the transmission line 2 connected to the field effect transistor gate, on the side opposite to said gate terminates at a resistive load 51 beyond which there is a "quarter-wave" line element 52.

All the wavelengths in question relate to the propagation in the dielectric medium of microstrip-type lines deposited on the substrate, i.e. the alumina layer 1. Resonator 50 is placed at a distance from line 2 which enables the maximum output power to be obtained and is centered on an axis XX perpendicular to the microstrip. On the other side of the line, an angle bracket 53 formed from two quarter-wave elements A and B has its element A disposed along axis XX.

In addition, the following arrangements must be respected:
1. The end of the transmission line furthest from the transistor is bent, so as to facilitate its connection to outlet 42 of structure 4. Moreover, it has a type of stud 35 bringing about an impedance matching between the drain (or the source, as applicable) of the transistor and line 3 loaded by a resistor 38.

Stud 35 is a microstrip line element perpendicular to the general direction of line 3. Its width e and its length 1 are adjusted by trial and error, so as to obtain the maximum power on the use side. The length of the stud is generally less than quarter the wavelength, thus providing a capacitance at the connection of the stud to line 3.

Moreover, resistor 38 is coupled in conventional manner from the d.c. supply voltage (applied at point 39) by means of an inductor 36 and a capacitor 37.
2. On its "high frequency" return to the ground of structure 4 transmission line 2 is coupled by a capacitor 54 and an inductor 55, the gate polarization being applied to point 56.

Figure 6:
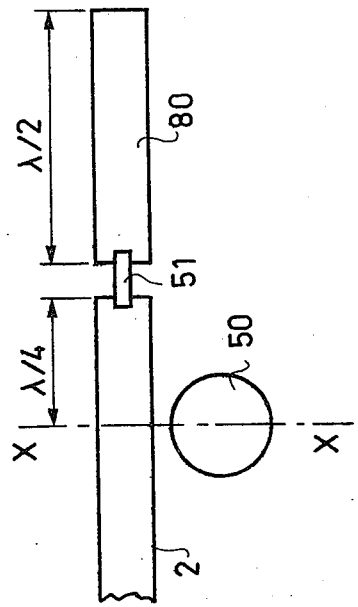
FIG. 6 a variant of FIG. 4.

According to a constructional variant partly shown in FIG. 6, transmission lines 2 and 3 are coupled by an interdigitated arrangement. The adjacent edges of lines 2 and 3 in the vicinity of the transistor are cut so as to form serrations, which interfit in one another. The connection of the transistor is then of the "common source" type with capacitive coupling. The positions of the source and drain can also be reversed (common drain connection).

Figure 7:
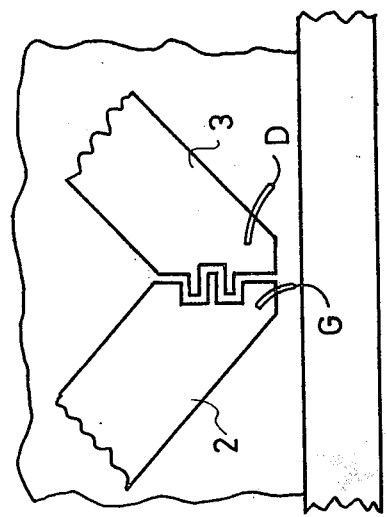

In a variant of FIG. 2 shown in FIG. 7 (in which the same references designate identical or similar elements), angle bracket 53 is differently positioned. Thus, branch A is parallel to line 2 instead of being perpendicular thereof and branch B is the furthest and not the nearest to axis XX. In addition, the bracket is displaced by a quarter-wave length towards the end of line 2. Load 51 and line element 42 remain unchanged.

Figure 8:
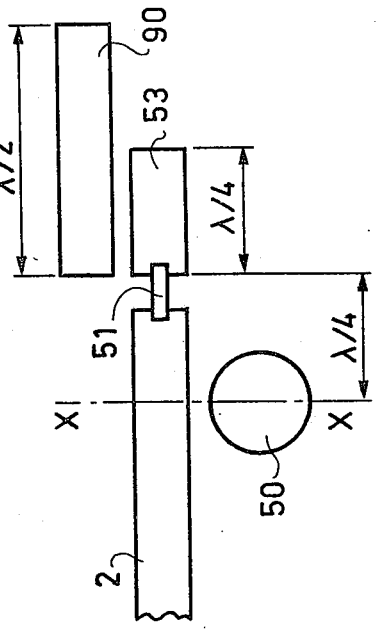
Figure 9:
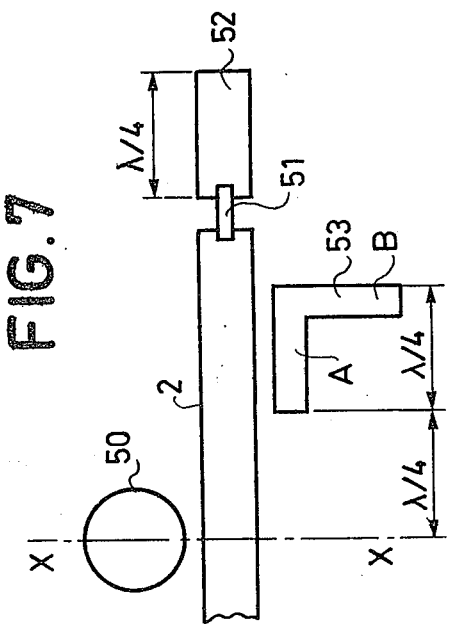

In the variants of FIG. 2 shown in FIGS. 8 and 9, there is no angle bracket 53. At the end of line 2 after load 51 there is either a half-wave line 80 (FIG. 8) in the place of the quarter-wave line 53, or a half-wave line 90 parallel and very close to line 53.

Besides the "common source" connection with capacitive coupling of the gate and drain lines, illustrated in FIG. 6, other possible connections are common source with inductance to ground, common drain and common gate with inductance to ground.

In FIGS. 5 and 7, the value of the resistor 51 is regulated in such a way that the oscillator is stable in the absence of the dielectric resonator. Angle bracket 53 is then arranged in such a way as to provide a rejection filter for the frequencies on either side of the selected oscillation frequency (that of resonator 50). Finally, resonator 50 is placed in a plane (diametral plane passing along axis XX) where the rejection filter brings about a short-circuit.

In FIGS. 8 and 9, resistor 51 is grounded by a zero or low impedance on either side of the selected oscillation frequency (that of resonator 50) for which said impedance becomes infinite. The resonator is positioned at a quarter-wave length from resistor 51.

The insulating substrate supporting the transmission lines can be made from dielectrics other than pure alumina and in particular silica or a combination of glass and polytetrafluoroethylene (Teflon).

Finally, if there is no leadless inverted device-type support, the field effect or bipolar transistor can be used as it is, or can be normally fitted on a cover-less case, which is used as a handling support for facilitating flip-chip welding.

What is claimed is:
1. An ultra-high frequency oscillator comprising:
an insulating substrate having first and second large faces, the second face being conductive to constitute a ground plane, said ground plane forming a projecting part beyond the substrate so as to form a flat area at the same level as one edge of the first face of the substrate;
two transmission lines of the microstrip type deposited on said first face, each of them having a terminal part close to one another and close to said one edge of said first face, and one of them being coupled to a dielectric resonator;
a transistor located on said ground plane near said terminal parts of said two transmission lines having a first electrode welded to said projecting part of said ground plane and two other electrodes welded respectfully to said transmission lines; and
each of said two transmission lines having a curved section therein.

2. An oscillator according to claim 1, wherein the transistor is mounted on a support permitting the flip-chip welding to said flat area of the ground plane and to each of the transmission lines.

3. An oscillator according to claim 2, wherein the support is of the leadless inverted device type having a first face on which the transistor is mounted and parallel faces at two levels different from that of the first face.

4. An oscillator according to claim 1, wherein the transistor is a field effect transistor whose gate is connected to said one transmission line which is coupled to said dielectrical resonator, the end of said one transmission line opposite said transistor being terminated by a resistor connected to a third microstrip line deposited on the substrate.

5. An oscillator according to claim 1, wherein the transistor is a bipolar transistor whose base is connected to said one transmission line which is coupled to said dielectric resonator, the end of said one transmission line opposite said transistor being terminated by a resistor connected to a second microstrip line deposited on the substrate.

6. An ultra-high frequency oscillator comprising:
a metal support having a base and upstanding walls, said base having a first part and a second part raised above said first part to form a ground plane;
an insulating substrate being supported by said metal support and covering said first part of said base, the upper surface of said substrate being at the level of said second part of said base;
a transistor mounted on said second part of said base and having three terminals, one of said terminals being electrically connected to said second part of said base;
a first transmission line of the microstrip type deposited on said substrate having a first end located near the location of said transistor on said second part of said base and a second end extending away from said second part of said base, said first transmission line having a curved section between said first end and said second end;
a second transmission line of the microstrip type deposited on said substrate having a first end located near said first end of said first transmission line and near the location of said transistor on said second part of said base and a second end extending away from said second part of said base, said second transmission line having a curved section near said second end;

a second terminal of said transistor being electrically connected to said first end of said first transmission line and a third terminal of said transistor being electrically connected to said first end of said second transmission line;

a stud line of the microstrip type connected to said second transmission near the center part thereof and having a direction perpendicular to the direction of said second transmission line, the length of said stud line being less than a quarter wavelength so as to provide a capacitance at the connection between said stud line and said second transmission line and an impedance matching between said third terminal and said second transmission line;

a dielectric resonator being located on one side of said first transmission line and coupled thereto, said resonator being at a distance therefrom so as to obtain the maximum output power;

an angle bracket line of the microstrip type located on the side of said first transmission line opposite said resonator, said angle bracket line formed of two quarter-wave segments connected at their ends at a 90° angle, one of said quarter-wave segments being parallel to said first transmission line;

a resistive load having a first terminal connected to said second end of said first transmission line and a second terminal; and a quarter-wave line of the microstrip type connected to said second terminal of said resistive load and extending in the same direction as said second end of said first transmission line.

7. The oscillator according to claim 6, further comprising:

resistor means having a first terminal connected to ground and a second terminal;

a first capacitor means having a first terminal connected to said second terminal of said resistor means, and a second terminal connected to said second end of said second transmission line;

a first inductor means having a first terminal connected to said second terminal of said first capacitor means and the second end of said second transmission line, and a second terminal forming a supply voltage input;

a second capacitor means having a first terminal connected to said second part of said base and a second terminal connected to said first transmission line; and a second inductor means having a first terminal connected to said second terminal of said second capacitor means and said first transmission line, and a second terminal forming a gate polarization input.

* * * * *